(12) United States Patent
Yeric

(10) Patent No.: US 8,154,353 B2
(45) Date of Patent: Apr. 10, 2012

(54) OPERATING PARAMETER MONITOR FOR AN INTEGRATED CIRCUIT

(75) Inventor: Gregory Munson Yeric, Austin, TX (US)

(73) Assignee: ARM Limited, Cambridge (GB)

( * ) Notice: Subject to any disclaimer, the term of this patent is extended or adjusted under 35 U.S.C. 154(b) by 128 days.

(21) Appl. No.: 12/588,961

(22) Filed: Nov. 3, 2009

(65) Prior Publication Data

US 2011/0102091 A1    May 5, 2011

(51) Int. Cl.
    *H03K 3/03* (2006.01)
(52) U.S. Cl. ............... 331/57; 331/175; 331/177 R
(58) Field of Classification Search ............ 331/57, 331/143, 34, 175, 65, 177 R; 365/222, 189.09, 365/211, 22; 327/142, 512
    See application file for complete search history.

(56) References Cited

U.S. PATENT DOCUMENTS

| | | | |
|---|---|---|---|
| 5,410,278 A | 4/1995 | Itoh et al. | |
| 6,104,256 A * | 8/2000 | Boudewijns | 331/143 |
| 6,731,558 B2 * | 5/2004 | Yamauchi et al. | 365/222 |
| 6,882,172 B1 | 4/2005 | Suzuki et al. | |
| 7,235,998 B1 | 6/2007 | Suzuki | |
| 2004/0263192 A1 | 12/2004 | Persun et al. | |
| 2007/0132523 A1 | 6/2007 | Newman | |
| 2009/0096495 A1 | 4/2009 | Keigo | |

FOREIGN PATENT DOCUMENTS

JP          55-70128          5/1980

OTHER PUBLICATIONS

UK Search Report dated Jan. 11, 2011 for GB 1014647.0.
U.S. Appl. No. 12/588,963, filed Nov. 3, 2009, Myers et al.
Chen et al, "A Three-Parameters-Only MOSFET Subthreshold Current CAD Model Considering Back-Gate Bias and Process Variation", IEEE, vol. 16, No. 4, Apr. 1997, pp. 343-352.

* cited by examiner

*Primary Examiner* — Joseph Chang
*Assistant Examiner* — Jeffrey Shin
(74) *Attorney, Agent, or Firm* — Nixon & Vanderhye P.C.

(57) ABSTRACT

An integrated circuit 2 is provided with one or more monitoring circuits 14, 16, 18, 20 in the form of ring oscillators 22. These ring oscillators 22 include a plurality of tri-state inverters 24, 26, 28 containing a current-limiting transistor 42 operating in a leakage mode. The leakage current through the transistor 42 is dependent upon an operating parameter of the integrated circuit 2 being monitored. Accordingly, the oscillation frequency $F_{osc}$ of the ring oscillator 22 varies in dependence upon the operating parameter to be measured.

21 Claims, 17 Drawing Sheets

$$I_D = I_0 * \exp\left\{\frac{V_{GS}}{nkT}\right\} \exp\left\{\left(1 - \frac{1}{n}\right)(V_{BS}/kT)\right\} \left\{1 - \exp\left(\frac{-V_{DS}}{kT}\right)\right\}$$

Where the fitting parameters are $I_0$, $n_0$ and $n_1$, with $$n = 1 + \frac{1}{n_0 + n_1 V_{BS}}$$

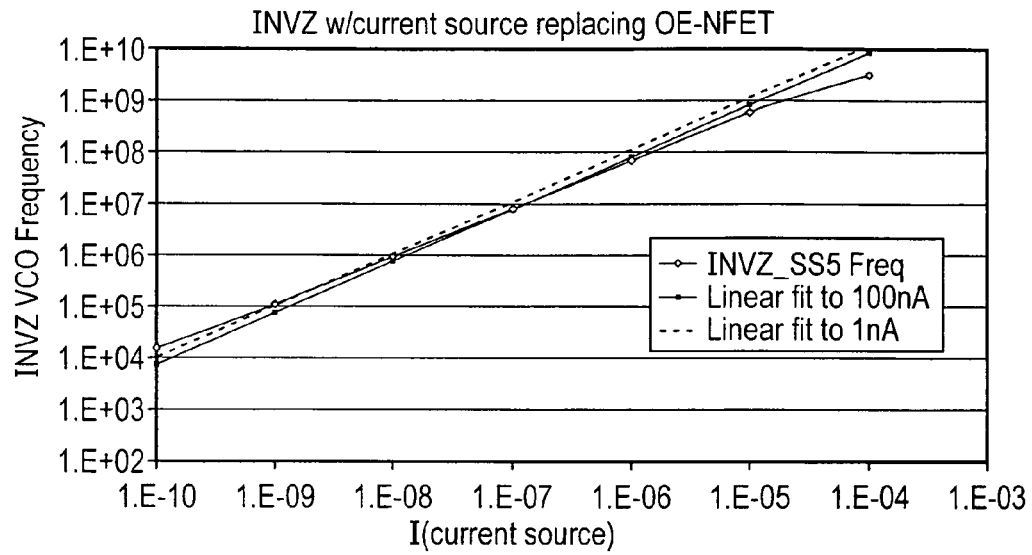
FIG. 20
| Current | Error |
|---|---|
| 1.00E-05 | 22% |
| 1.00E-06 | 9% |
| 1.00E-07 | 0% |
| 1.00E-08 | -13% |
| 1.00E-09 | -35% |
| 1.00E-10 | -103% |
FIG. 21
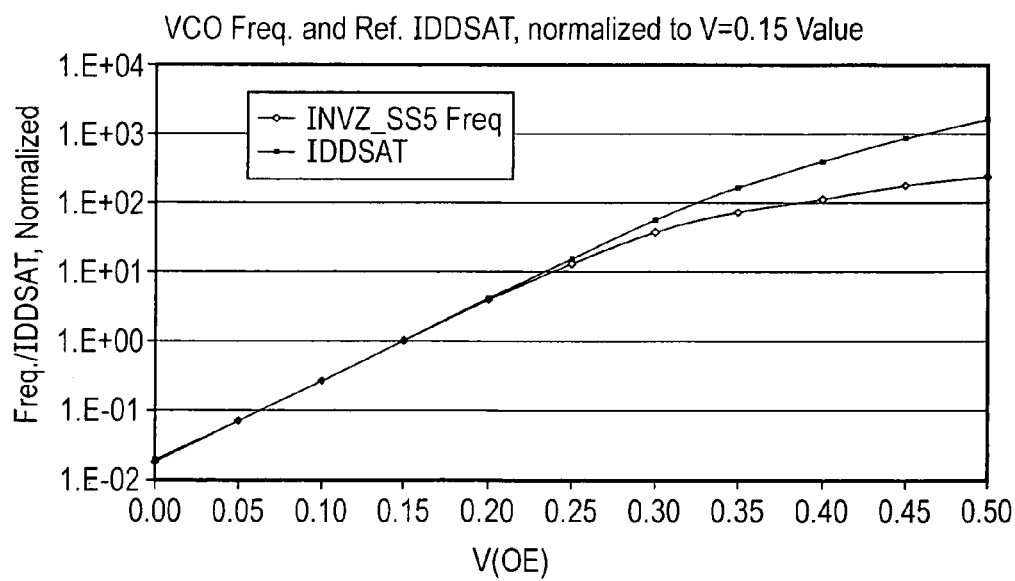
FIG. 22

OPERATING PARAMETER MONITOR FOR AN INTEGRATED CIRCUIT

BACKGROUND OF THE INVENTION

1. Field of the Invention

This invention relates to the field of integrated circuits. More particularly, this invention relates to the monitoring of an operating parameter within an integrated circuit.

2. Description of the Prior Art

It is known to provide an integrated circuit with one or more monitoring circuits which seek to provide monitoring information regarding operating parameters of the integrated circuit. A typical operating parameter to be monitored is operating temperature. Other operating parameters which may be monitored include an operating voltage. This information can be used to ensure correct operation of the integrated circuit and may, in some circumstances, be used to adjust the operation using a feedback mechanism.

It is known to provide ring oscillator circuits in which the oscillation frequency gives an indication of the operating temperature of an integrated circuit. As the integrated circuit heats up, the transistors making up the inverter chain within the ring oscillator will operate more rapidly and accordingly the oscillation frequency will increase. A problem with such mechanisms is that the relationship between oscillation frequency and temperature can be complex and the ring oscillator may require relatively complicated biasing circuits and/or analogue outputs.

As process geometries diminish in size, local variation of basic MOSFET characteristics become so large that simple chip-level guard-banded designs become heavily over designed and inefficient. In addition, key systematic effects, such as implant shadowing or stress engineering effects multiply the number of permutations of MOSFET implementations that should be monitored in order to minimise over design around systematic effects. Owing to such effects, MOSFET characteristics have become location and context-specific. Accordingly, relying on a simple set of boundary-provided wafer acceptance test MOSFET parameters will be less accurate than system-on-chip embedded MOSFET monitors due to context-dependent effects and local variations that cannot be monitored from the distant areas where wafer monitors are provided. Accordingly, there is a need for a small and low-power monitoring circuit for embedded MOSFET monitoring as well as silicon acceptance testing, performance binning and adaptive circuits.

SUMMARY OF THE INVENTION

Viewed from one aspect the present invention provides a method of monitoring an operating parameter of an integrated circuit, said method comprising the steps of:
generating an oscillating signal at an oscillation frequency with a ring oscillator comprising a plurality of serially connected inverting stages;
operating at least one of said inverting stages such that at least one transistor supplying current to said inverting stage limits current flow in and output signal slew rate of said inverting stage and thereby controls said oscillation frequency; and
supplying a gate voltage to said transistor to operate said transistor in a leakage mode in which substantially all current flow through said transistor is by current leakage; wherein said operating parameter controls a magnitude of said current leakage such that said oscillation frequency is dependent upon said operating parameter.

A ring oscillator with at least one inverting stage having a transistor supplying a limited current flow in the inverting stage will serve to limit the slew rate of that inverting stage and accordingly control the oscillation frequency of the ring oscillator (the inverting stage could have a variety of different forms such as a simple inverter, a NAND gate, etc). The present technique recognises that if this transistor serving to control the oscillation frequency is operated in a leakage mode in which substantially all of the current flow through the transistor is by current leakage, then the current leakage has a predictable variation with a number of operating parameters it may be desired to monitor and accordingly those parameters may be monitored by observing the oscillation frequency of the ring-oscillator. Operating a ring oscillator in this way provides a monitoring circuit which is small, low cost and low power whilst providing the ability to monitor a variety of parameters of the integrated circuit.

In some embodiments the operating parameter which it may be desired to monitor is the leakage current through the transistor at a given gate voltage. The transistor operating in the leakage mode may be typical of other transistors within the integrated circuit and a critical parameter of all these transistors is the leakage current variation with voltage. In this way, appropriate control voltages can be determined to reduce the power wastage through current leakage.

A further operating parameter of particular interest is the threshold value of the gate voltage at which the leakage current is substantially zero. It is often desirable in low power integrated circuits to place the integrated circuits into a low power mode at which it is desired to reduce leakage current to substantially zero. Accordingly, the monitoring circuit is able to actively determine the gate voltage to be used to achieve substantially zero leakage in the transistor of the monitoring circuit and throughout the integrated circuit in order to achieve substantially zero leakage current.

In some embodiments such a threshold value may be determined by:
identifying a maximum transconductance gate voltage of said transistor as a gate voltage at which a rate of increase of said oscillation frequency with gate voltage is a maximum;
linearly backward extrapolating from said maximum transconductance gate voltage and said rate of increase of oscillation frequency at said maximum transconductance gate voltage to identify an extrapolated gate voltage at which said oscillation frequency would be zero; and
using said extrapolated gate voltage as said threshold value.

Another operating parameter which the present techniques are well suited to monitoring is an operating temperature of the transistor within the ring oscillator. This operating temperature may be well correlated with the operating temperature of surrounding portions of the integrated circuit.

When the transistor is a MOSFET having a source voltage and a bulk voltage and the transistor is operated such that the voltage difference between the gate voltage and the source voltage is substantially equal to the voltage difference between the bulk voltage and the source voltage, then a simplified relationship between the operating temperature and the oscillation frequency is obtained with many device specific parameters substantially cancelling from the relationship.

In particular, in such embodiments the leakage current is proportional to $e^{V_{BS}/kT}$, where e is the base of natural logarithms, k is the Boltzmann constant and T is said operating temperature.

In order to calibrate such a temperature monitoring circuit the following steps may be performed:

(a) providing said integrated circuit including said ring oscillator at a known temperature $T_{known}$;

(b) setting said voltage difference VBS between said bulk voltage and said source voltage to a first value $VBS_0$;

(c) measuring a first oscillation frequency $F_0$ of said ring oscillator;

(d) setting said voltage difference VBS between said bulk voltage and said source voltage to a second value $VBS_1$;

(e) measuring a second oscillation frequency $F_1$ of said ring oscillator;

(f) determining a calculated temperature $T_{cal}$ as $(VBS_1-VBS_0)/(k*\ln(F_0/F_1))$; and (g) calculating an offset temperature $T_{offset}$ as $T_{cal}-T_{known}$; whereby an unknown temperature $T_{unknown}$ of said integrated circuit can then be determined by repeating steps (b) to (f) and determining $T_{unknown}$ as $T_{cal}-T_{offset}$.

It may be that only a single stage within the ring oscillator includes a transistor operating in leakage mode and limiting current flow in and output slew rate of its associated inverting stage. However, in preferred embodiments a stronger effect may be achieved when a plurality of inverting stages include such transistors operating in a leakage mode. In some embodiments it may be that the inverting stages within the ring oscillator each include a transistor operating in the leakage mode.

The inverters may have a variety of different forms, but are preferably tri-state inverters.

When using tri-state inverters, the header transistor and the footer transistor may be formed on different rails through the integrated circuit than a rail at which the output of the tri-state inverter is generated in order to reduce body effects relative to when these transistors are provided in the same rail as the output of the inverting stage.

The transistor operating in the leakage mode may be formed having a different size to the other transistors forming the inverter in order to sensitize the monitor circuit to different parameters and different measurement ranges.

The transistor which is operated in the leakage mode may be an NMOSFET or a PMOSFET.

Viewed from another aspect the present invention provides a monitoring circuit configured to monitor an operating parameter of an integrated circuit, said monitoring circuit comprising:

a ring oscillator having a plurality of serially connected inverting stages configured to generate an oscillating signal at an oscillation frequency, at least one of said inverting stages having at least one transistor configured to supply current to said inverting stage and to limit current flow in and output signal slew rate of said inverting stage thereby controlling said oscillation frequency; and gate voltage supply circuitry configured to supply a gate voltage to said transistor to operate said transistor in a leakage mode in which substantially all current flow through said transistor is by current leakage; wherein said operating parameter controls a magnitude of said current leakage such that said oscillation frequency is dependent upon said operating parameter.

Viewed from a further aspect the present invention provides a monitoring circuit configured to monitor an operating parameter of an integrated circuit, said monitoring circuit comprising:

ring oscillator means having a plurality of serially connected inverting stage means for generating an oscillating signal at an oscillation frequency, at least one of said inverting stage means having at least one transistor means for supplying current to said inverting stage means and to limit current flow in and output signal slew rate of said inverting stage means thereby controlling said oscillation frequency; and gate voltage supply means for supplying a gate voltage to said transistor means to operate said transistor means in a leakage mode in which substantially all current flow through said transistor means is by current leakage; wherein said operating parameter controls a magnitude of said current leakage such that said oscillation frequency is dependent upon said operating parameter.

The above, and other objects, features and advantages of this invention will be apparent from the following detailed description of illustrative embodiments which is to be read in connection with the accompanying drawings.

BRIEF DESCRIPTION OF THE DRAWINGS

FIG. 20 illustrates the relationship between the ring oscillator frequency and current through the tri-state inverter when the transistor operating in the leakage mode is replaced by an ideal current source;

FIG. 21 is a table illustrating the absolute errors in measured frequency with respect to current through the tri-state inverter;

FIG. 22 illustrates the oscillator frequency variation with gate voltage of the transistor operating in leakage mode together with the saturation current through the transistor;

DESCRIPTION OF THE PREFERRED EMBODIMENTS

Figure 1:
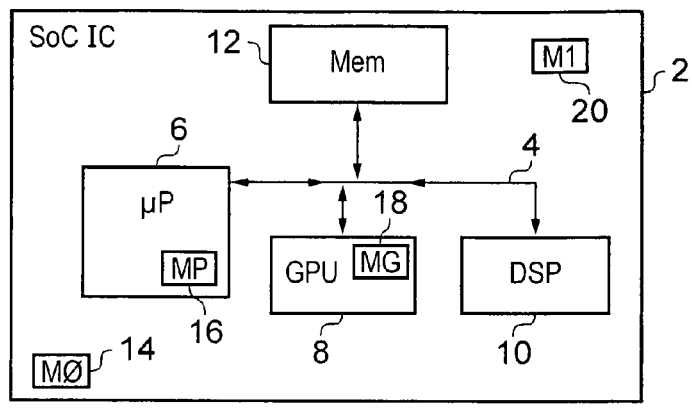
FIG. 1 schematically illustrates an integrated circuit including a number of monitoring circuits for monitoring operating parameters of the integrated circuit.

FIG. 1 schematically illustrates a system-on-chip integrated circuit 2 including a plurality of functional units interconnected via a system bus 4. The functional units include a processor core 6, a graphics processing unit 8, a digital signal processor 10 and a memory 12. It will be appreciated that the present techniques are applicable in a wide variety of different integrated circuits.

Located within the integrated circuit 2 are a plurality of monitoring circuits 14, 16, 18, 20. The monitoring circuit 16 is located within the processor 6 and serves to monitor an operating parameter of the processor 6. This operating parameter may be, for example, threshold voltage levels associated with a low power state for reducing leakage current, an operating temperature or the like. In a similar way, the graphics processing unit 8 has a monitor circuit 18 embedded within the graphics processing unit 8. Further monitoring circuits 14, 20 are provided at spaced positions upon the integrated circuit 2 to monitor parameters such as the operating temperature and/or threshold voltage.

It will be appreciated that with modern integrated circuits, operating parameters such as operating temperature may vary within an integrated circuit 2, such that one particular portion of that integrated circuit may be operating too hot at the same time as another portion is operating at an acceptable temperature. Accordingly, the provision of multiple monitoring circuits 14, 16, 18, 20 distributed within the integrated circuit provides a greater degree of protection from inappropriate operation and permits a more accurate and fine-grained level of operating parameter monitoring to be achieved. Furthermore, process variations across the integrated circuit 2, such as variations in alignment, doping, layer thickness etc, may result in different operating parameters occurring at different locations within the same integrated circuit and accordingly distributing a plurality of monitoring circuits 14, 16, 18, 20 through the integrated circuit 2 enables such different operating parameters to be correctly sensed.

Figure 2:
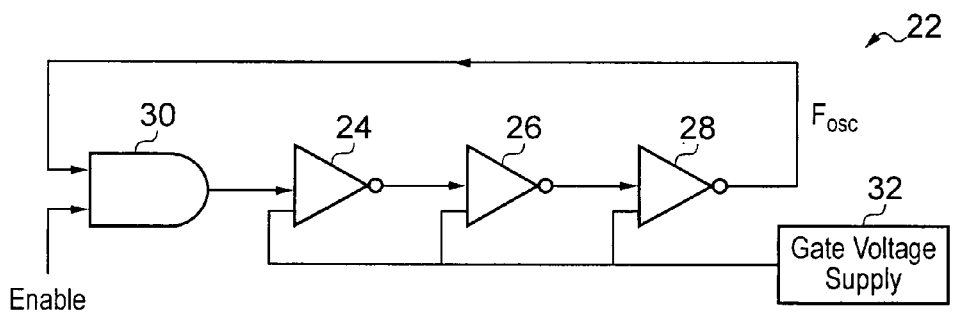
FIG. 2 schematically illustrates a monitoring circuit in the form of a ring oscillator (RO)

FIG. 2 schematically illustrates a monitoring circuit 22 in the form of a ring oscillator having an oscillation frequency $F_{osc}$. The ring oscillator is formed of three inverters 24, 26, 28 arranged in series and with a feedback path from the last inverter 28 in the series back to the input of the first inverter 24 in the series. Providing there are an odd number of inverters 24, 26, 28 (or more generally signal inversions) within the signal path, then an oscillating signal output will be generated with a frequency $F_{osc}$ controlled by the delay through the inverter chain 24, 26, 28. An AND gate 30 is provided in the signal path and serves to enable and disable the signal path fed back through the ring oscillator and accordingly switch the ring oscillator on and off in dependence upon an enable signal.

The individual inverters 24, 26, 28 are formed as tri-state inverters and one of the transistors within these tri-state inverters has a gate voltage controlled with a gate voltage supply circuit 32. This gate voltage supply circuit 32 generates a gate voltage which places the controlled transistor within the inverter 24, 26, 28 into a leakage mode of operation in which current flow through that transistor is substantially all by current leakage. This transistor acts as a current limiting device for its inverting stage. Those within this technical field will recognise that current leakage is the process by which a finite amount of current passes through a transistor when the control signals to that transistor are such that it would normally be considered to be switched off. Nevertheless, effects such as quantum tunnelling result in a finite leakage current.

Figure 3:
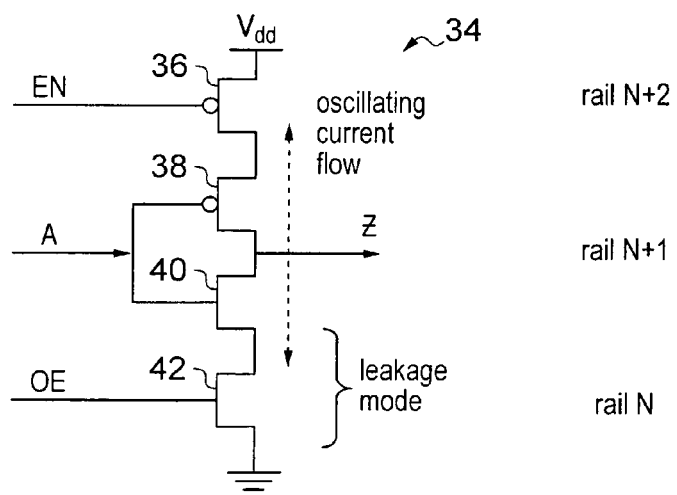
FIG. 3 schematically illustrates a tri-state inverter for use within the ring oscillator of FIG. 2.

FIG. 3 schematically illustrates a tri-state inverter 34 formed as a stack of two PMOSFET transistors 36, 38 and two NMOSFET transistors 40, 42. The transistors 36 and 42 are formed on a different rail through the integrated circuit than the input and output rail carrying the signals A and Z respectively. This reduces body effects. The transistors 36 and 42 have a larger device width than the transistors 38 and 40 as this permits more reliable operation at the normal rail voltages e.g. ground on OE and Vdd on EN.

In operation the gate voltage OE applied to the transistor 42 is such that it places the transistor 42 into a leakage mode of operation. The transistor 42 thus acts as a current limiting device which limits the slew rate of the output signal Z generated by the inverter 34. It will be appreciated that the transistors 36, 38, 40 and 42 together with the associated connecting and signal transmission lines have a finite capacitance and accordingly limiting the current flow through the inverter 34 restricts the slew rate that can be achieved in the output signal Z and accordingly limits the propagation delay through the tri-state inverter 34. Thus, when one or more such tri-state inverter 34 are placed within a ring oscillator 22, such as illustrated in FIG. 2, then the gate voltage OE which controls the current flow through the tri-state inverter 34 will in turn control the oscillation frequency $F_{osc}$ of the ring oscillator 22.

It will be appreciated from the above that the oscillation frequency $F_{osc}$ of the ring oscillator 22 provides a measure of the leakage current through the one or more transistors 42 which are acting as current limiting transistors. The output signal from the ring oscillator may require a waveform conditioning circuit such that it can be expanded to a rail-to-rail signal for ease of sensing, but the oscillation frequency $F_{osc}$ is sufficiently low that such a conditioning circuit may be readily formed, for example, as a basic Schmidtt trigger. The ring oscillator 22 has a simple construction and operation compared to modern highly complex integrated circuits. The provision of such a small ring oscillator 22 constitutes relatively little circuit overhead. The output frequencies of the ring oscillator signal $F_{osc}$ are sufficiently low that they are not difficult to measure. A relatively large degree of variation in the oscillator frequency $F_{osc}$ with leakage current is achieved giving a good degree of sensitivity.

Various operating parameters of the integrated circuit 2 may be monitored by detecting their effect upon the leakage current through the transistor 42 serving as a current limiting device and accordingly their effect upon the oscillation frequency $F_{osc}$. One example of such a parameter is a threshold value of the gate voltage OE at which the leakage current through the transistor 42 is substantially zero. This threshold voltage when detected may be used throughout the integrated circuit 2 in order to place the integrated circuit 2 into a low leakage mode (or portions of the integrated circuit 2) matched to the individual integrated circuit and its present operating state/environment.

Figure 4:
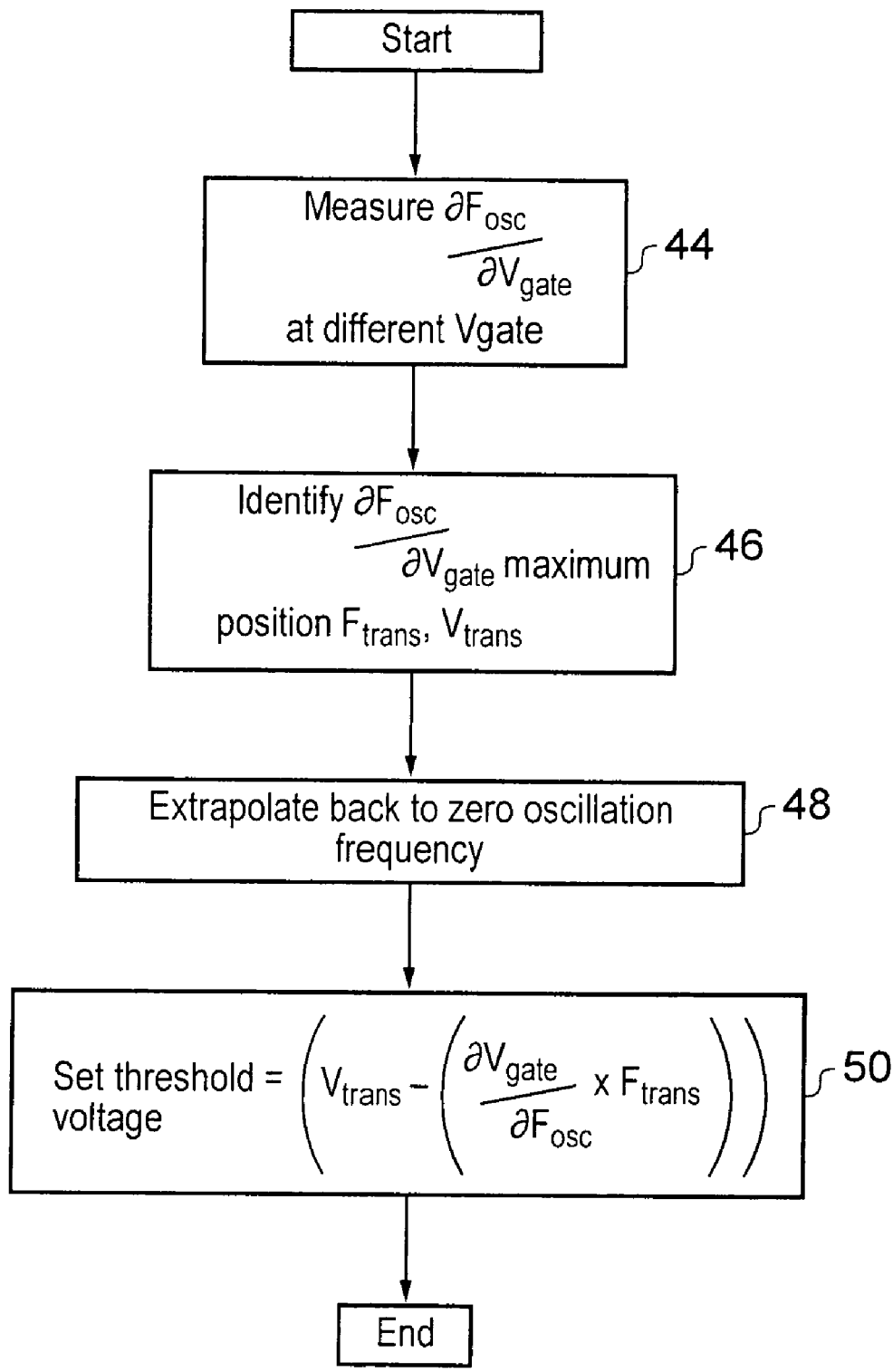
FIG. 4 is a flow diagram schematically illustrating a technique for determining a threshold voltage for substantially zero leakage current within an integrated circuit.

FIG. 4 illustrates a process by which the threshold voltage may be determined. At step 44 a measurement of the rate of change of oscillation frequency with gate voltage is made at different gate voltages. Step 46 then identifies the gate voltage $V_{trans}$ and frequency $F_{trans}$ corresponding to the position at which the rate of change of oscillation frequency with gate voltage is at its maximum. This corresponds to the point of maximum transconduction within the transistor 42.

Steps 48 and 50 (which may be considered to be combined) serve to extrapolate back from the maximum transconductance $F_{trans}$, $V_{trans}$ point to find a voltage which the extrapolation indicates results in a zero oscillation frequency. Thus voltage is calculated by a linear extrapolation using the formula illustrated in step 50 where the rate of change of gate voltage with oscillation frequency is the maximum rate of change detected at the point of maximum transconduction.

Figure 5:
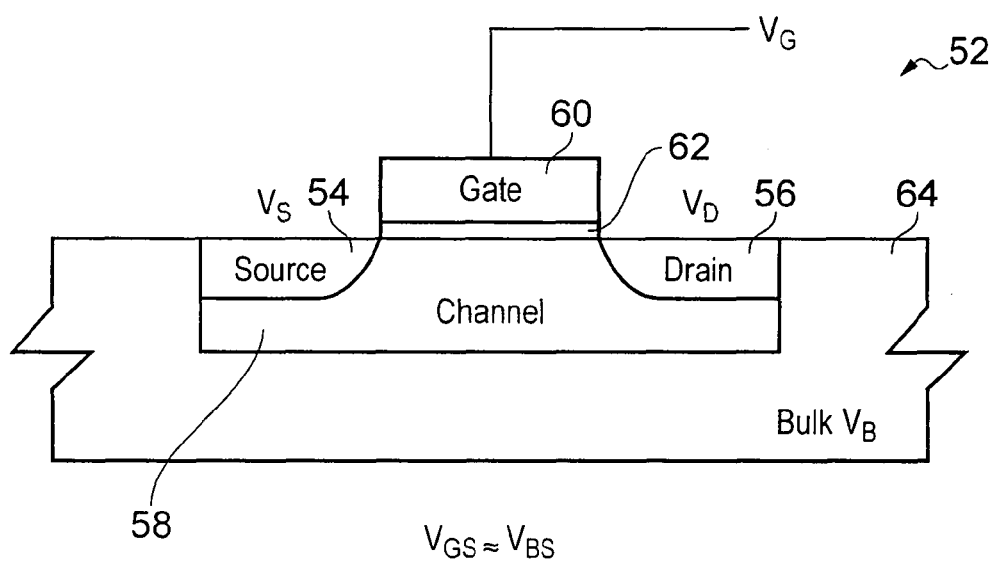
FIG. 5 schematically illustrates a cross-section through a field effect transistor.

FIG. 5 schematically illustrates a cross-section through a field effect transistor 52. The field effect transistor includes a source region 54 a drain region 56 and a channel region 58 extending between the source region 54 and the drain region 56. A gate 60 separated from the channel region 58 by an insulating layer 62 serves to control current flow between the source region 54 and the drain region 56 through the channel region 58. The channel region 58 and the other portions of the field effect transistor 52 are formed on a bulk semi-conductor region 64. The gate 60 is held at a gate potential $V_G$. The source 54 is held at a source potential $V_S$. The drain is held at a drain potential $V_D$. The bulk semi-conductor 64 is held at a bulk potential $V_B$.

In embodiments of the monitoring circuit described herein which serve to act as temperature sensors, a simplified relationship between temperature and leakage current through the transistor 52 may be achieved when the voltage difference between the gate and the source $V_{DS}$ (i.e. $V_G$–$V_S$) is equal to the voltage difference between the bulk and the source $V_{BS}$ (i.e. $V_B$–$V_S$). This will be described further below.

Figure 6:
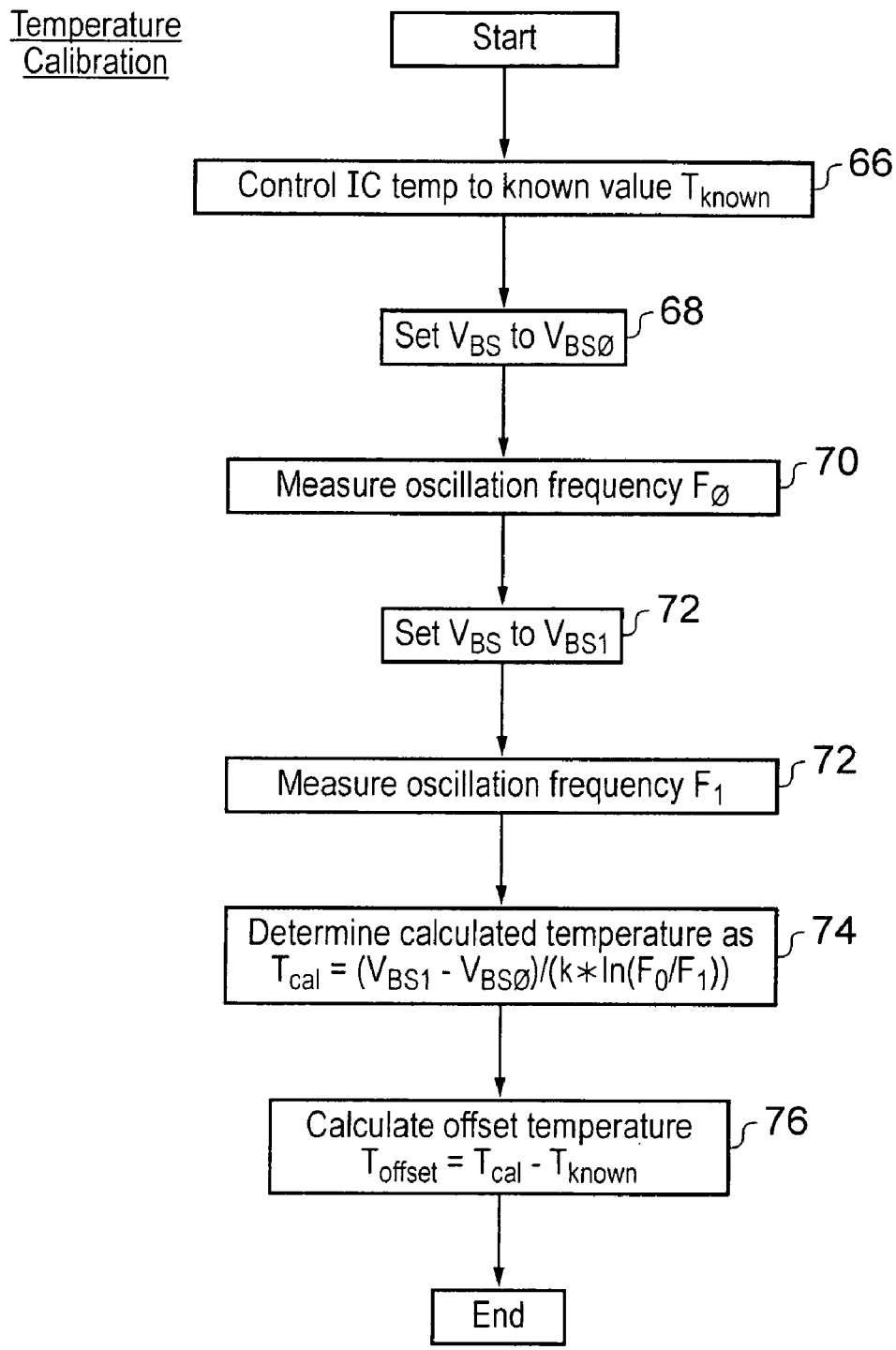
FIG. 6 is a flow diagram schematically illustrating a technique for calibrating a temperature monitoring circuit.
Figure 7:
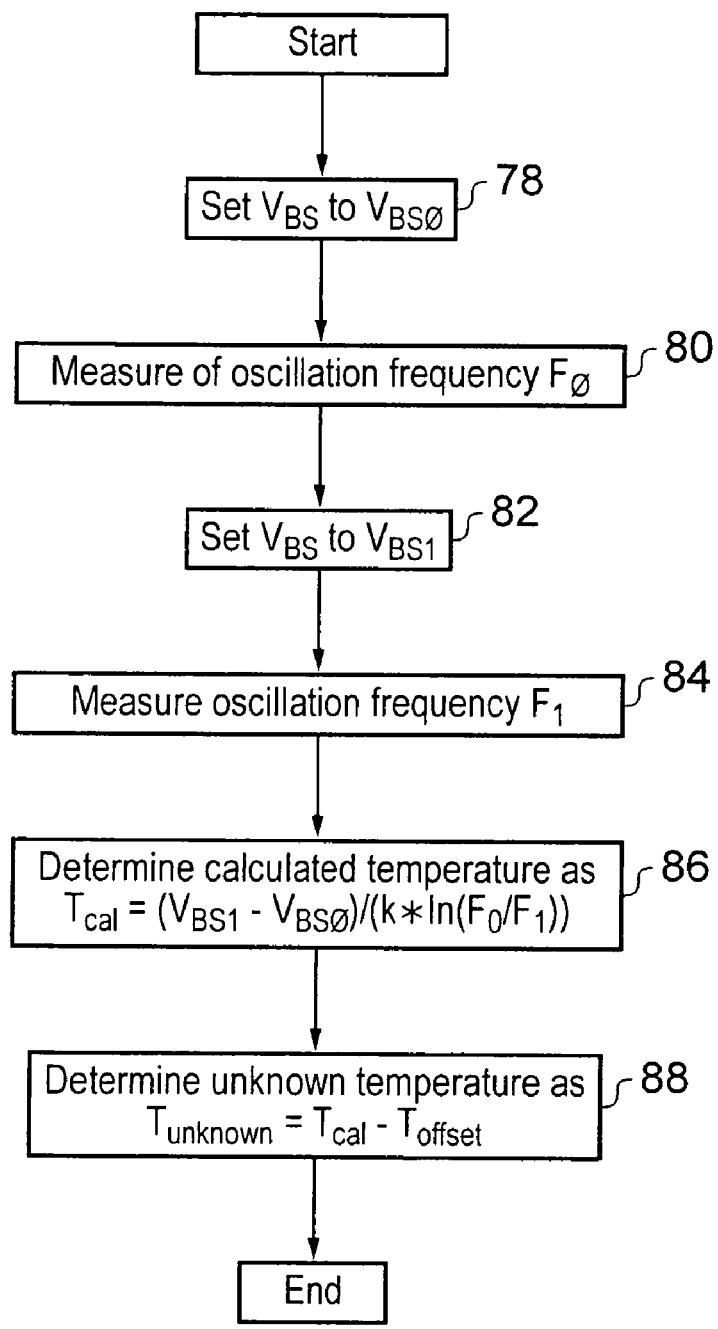
FIG. 7 schematically illustrates a technique for measuring an unknown temperature with a temperature monitoring circuit.

FIGS. 6 and 7 respectively schematically illustrate a process for calibrating a monitoring circuit 14, 16, 18, 20 for monitoring temperature and using that monitoring circuit 14, 16, 18, 20 to measure an unknown temperature. FIG. 6 starts with step 66 setting a known temperature value $T_{known}$ for the integrated circuit 2 including the embedded monitoring circuit 14, 16, 18, 20. Step 68 sets the voltage difference between the bulk and the source $V_{BS}$ to a first value $V_{BS0}$. The voltage between the gate and the source $V_{GS}$ is the same value due to the internal connections with the inverter used as a temperature monitor. Step 70 measures the oscillation frequency $F_0$ at the known temperature $T_{known}$ and first voltage $V_{BS0}$.

Step 72 sets the voltage $V_{BS}$ to a second value $V_{BS1}$ (the voltage between the gate and the source changes in the same manner). Step 72 measures the oscillation frequency $F_1$ at this second control voltage $V_{BS1}$.

Step 74 calculates a temperature for the integrated circuit 2 using the values of $V_{BS0}$ and $V_{BS1}$ and their associated oscillation frequencies $F_0$ and $F_1$ in accordance with the relationship shown in step 74. The difference between the temperature calculated $T_{cal}$ and the known temperatures $T_{known}$ is used to calculate an offset temperature $T_{offset}$ at step 76. This offset temperature $T_{offset}$ can then be used as a calibration value during measurement of unknown temperatures in accordance with FIG. 7.

FIG. 7 illustrate a process for measuring an unknown temperature once the monitoring circuit 14, 16, 18, 20 has been calibrated in accordance with the process of FIG. 6. At step 78 the voltage $V_{BS}$ between the bulk and the source is set to a first value $V_{BS0}$. Step 80 measures the oscillation frequency $F_0$ at this first control voltage. Step 82 sets the voltage $V_{BS}$ to a second value $V_{BS1}$ and step 84 measures the oscillation frequency $F_1$ at this second control voltage. Step 86 determines a calculated temperature using the two measured frequencies $F_0$ and $F_1$ together with the control voltages $V_{BS1}$ and $V_{BS0}$ in accordance with the relationship shown in step 86 of FIG. 7. Step 88 calculates the unknown temperature using the calculated temperature $T_{cal}$ from step 86 together with the offset temperature $T_{offset}$ as previously calculated.

Figure 8:
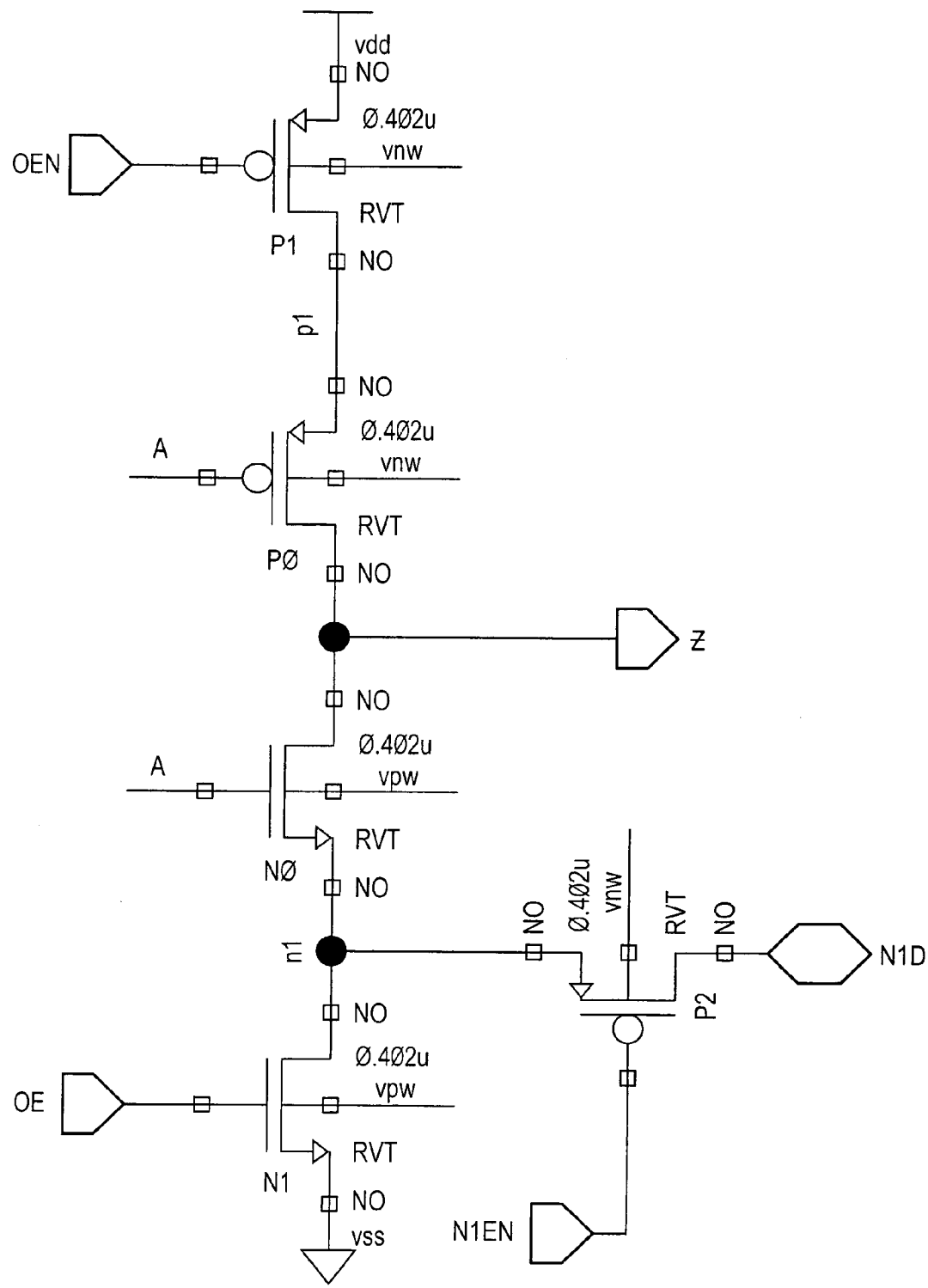
FIG. 8 illustrates a tri-state inverter for use within a ring oscillator serving as a threshold voltage monitoring circuit and including a transistor P2 provided for simulation purposes (i.e. not required in the working design)

The core of the monitoring circuit is a ring oscillator formed using standard or modified tri-state inverter cells (INVZ) as illustrated in FIG. 8. As compared to a standard INVZ, the example INVZ schematic of FIG. 8 moves the tri-state switches to the adjacent rails. This is not required but can potentially increase accuracy due to reduced body effects as compared to when devices P1/N1 are next to the output Z. The P2 device is for simulation purposes and is not required in the functioning implementation. If for instance N1EN is connected to the oscillator enable signal, then when the oscillator is not enabled the drain current of device N1 can be measured, for comparison to the frequency results of the ring oscillator of the present technique.

Figure 9:
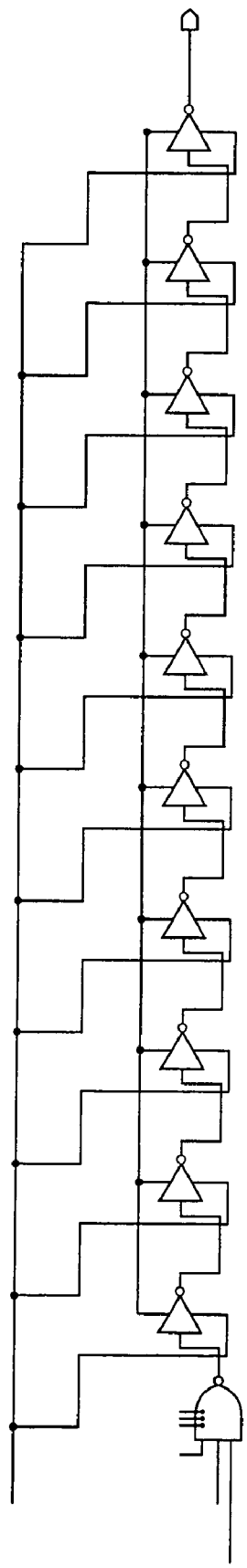
FIG. 9 schematically illustrates a ring oscillator circuit for monitoring an threshold voltage and including a NAND gate to enable the ring oscillator.

This INVZ gate is then used to form a ring oscillator with one possible implementation shown in FIG. 9.

In this case one NAND gate has been added to provide oscillator enable function. In the example shown the OE pins are tied to VDD and the OEN pins are tied to POWER_EN_N which in this use is a variable analog signal. The number of stages is arbitrary, but it should be noted that this oscillator can be reliably operated with fewer stages than shown, due to the slow operating speeds and power consumption due to the nA-range current limited operation. The basic ring oscillator requirement of an odd total number of stages (including NAND) is observed. Observation can be made directly from a frequency counter circuit or external tester frequency counter.

Figure 10:
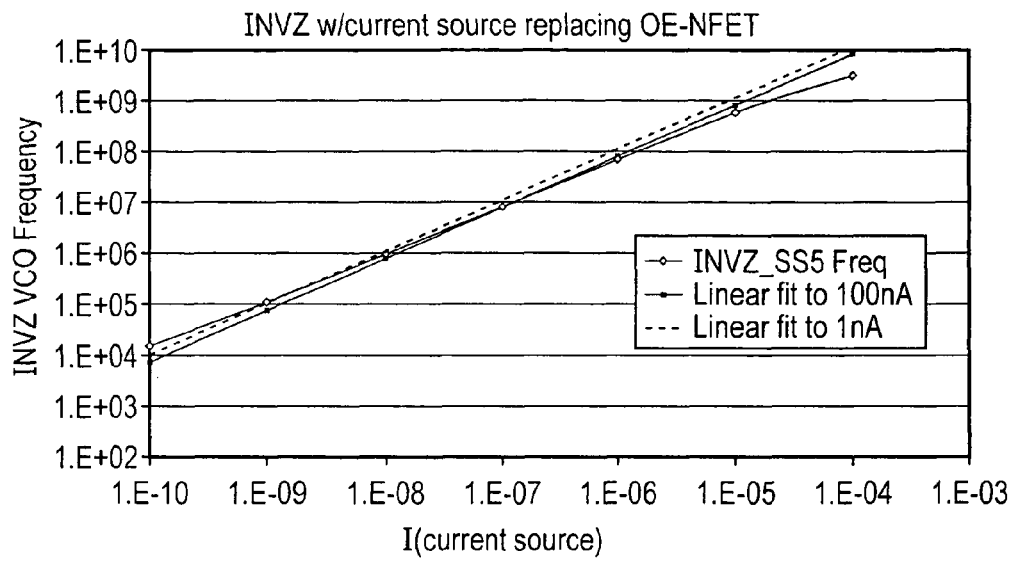
FIG. 10 schematically illustrates the variation in ring oscillator frequency with the current through the tri-state inverting stages being controlled either by an ideal current source or the transistor N1 of FIG. 8.

The operation of this circuit is that the MOSFET(s) used as oscillator current limiters be biased in the near- or sub-threshold region (i.e. in a leakage mode of operation), so that oscillation frequency is proportional to the current. Simulations using industry-representative 32 nm MOSFET PSP HSPICE models show that this assumption is valid across a suitable bias temperature, voltage, and process corner. In FIG. 10, the NMOS pull down FET (device N1 of FIG. 8) has been replaced with an ideal current source in a SPICE simulation. This simulation shows the accuracy of the assumption that F is directly proportional to I. The INVZ line represents the circuit frequency as a function of the feeding current from the current source.

FIG. 10 shows ring oscillator frequency compared to an ideal current source replacing transistor N1. Simulating the actual circuit (MOSFET N1 instead of current source of FIG. 10), there is good agreement between RO Frequency and MOSFET N1 drain current as shown below in FIG. 11. In order to plot on the same graph, both curves have been normalized to their value at 0.3V (~Vt).

Figure 11:
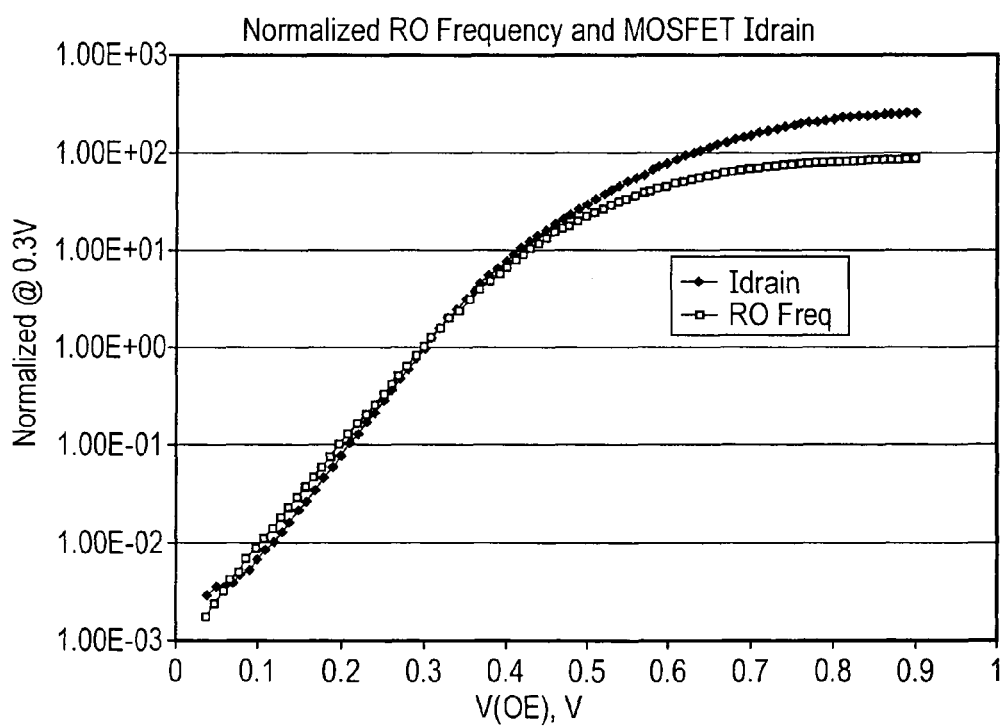
FIG. 11 schematically illustrates the relationship between the ring oscillator frequency and current through the transistor operating in its leakage mode (both normalised to their values at 0.3V) with gate voltage of the transistor.

FIG. 11 shows MOSFET N1 drain current and RO frequency, both normalized to VOE=0.3V values.

Within limited accuracy, this illustrates that the RO frequency in the subthreshold regime tracks the MOSFET drain current well and therefore the slope of RO frequency in the subthreshold region can be directly used to approximately measure the subthreshold slope of the MOSFET drain current (MHz/decade to mV/decade).

Figure 12:
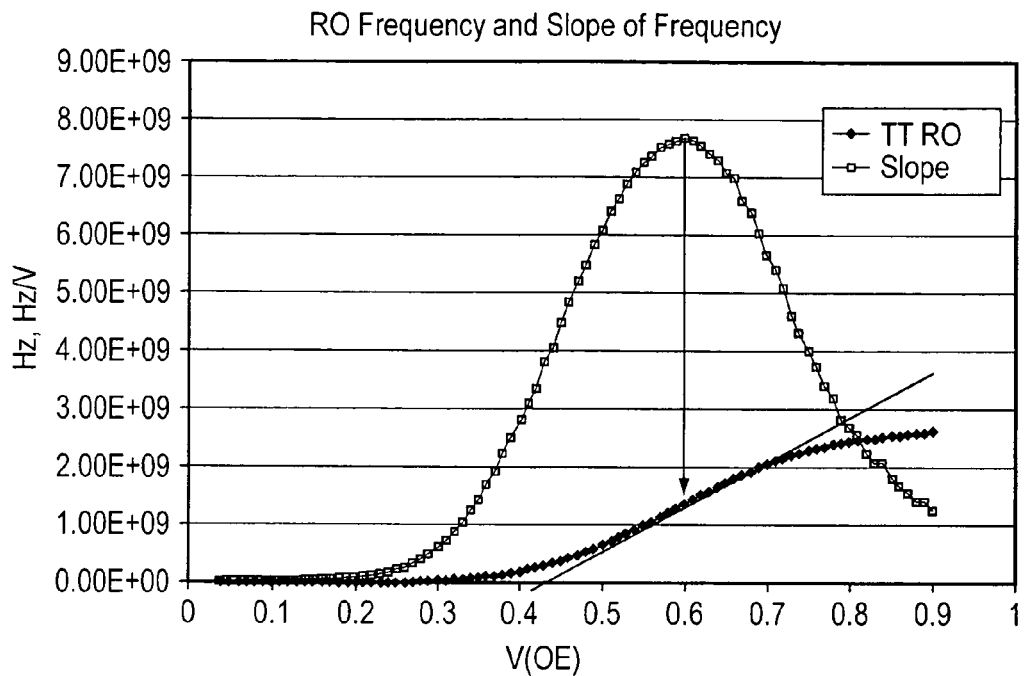
FIG. 12 schematically illustrates ring oscillator frequency and the rate of change of ring oscillator frequency with voltage as this varies with the variation in gate voltage applied to the transistor operating in the leakage mode.

Secondly, since the RO frequency tracks the MOSFET drain current reasonably well through up to the threshold voltage, the slope of RO frequency can be used in the same manner as the method of maximum transconductance extrapolation of MOSFET Vt. In this method, the peak transconductance point is determined, and the MOSFET I-V curve is extrapolated back to its X-intercept. This same method is shown below in FIG. 12 using the RO frequency. The peak in the slope is used to determine the VOE point at which the Y intercept is extrapolated.

Figure 13:
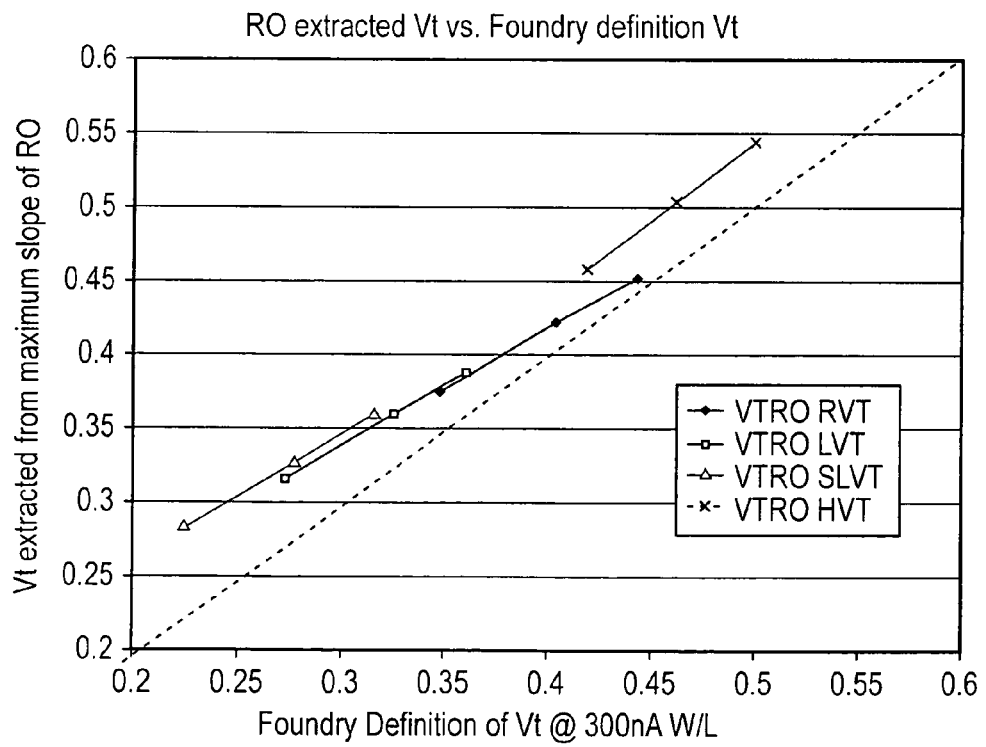
FIG. 13 schematically illustrates the variation in threshold voltage determined with the monitoring circuits discussed above compared with the foundary definition of threshold voltage for various transistors.

FIG. 13 shows the actual Vt of the device N1 is compared to the extrapolated Vt from the RO frequency characteristics. In this particular case, the foundry definition of Vt is a constant current density definition. Even so, the agreement is good. In general, the RO Frequency extrapolation method overestimates Vt by ~20-30 mV.

There is a slight slope difference between the RO extracted and the actual Vt, this result is accurate enough for silicon acceptance testing and moderate adaptive methods.

Reasons for discrepancies:
1. The circuit itself (see FIG. 8) does exhibit some non-ideality in slope as compared to the current source limiting RO frequency.
2. The definition of Vt by the foundry as a constant current value may be introducing some skew across process corner.
3. Rigorously, Vt is defined as the X-intercept of the maximum transconductance point minus Vdrain/2. I was not able to show that determining Vdrain/2 for the device N1 and subtracting that amount provided any additional accuracy.

Finally, since in many cases the MOSFET Vt can be defined as a known current density in (e.g., nA*W/L), the frequency of the RO at the extracted Vt can be directly related to an absolute current. That is, one determines the Vt value using RO slope extrapolation, then equates that to the foundry defined constant current value for that MOSFET at Vg=Vt. Then, one can approximate the VG=0 off state leakage using the following formula:

$$Ioff = RO \text{ frequency at } VOE=0/\text{frequency at } VOE=Vt * \text{Constant Current definition } @Vt.$$

There are many sources of error in this method of determining MOSFET Ioff, including error in RO Vt measurement, error in RO subthreshold slope, and error in RO frequency at very low currents, but as can be seen from FIG. 4, this method can be accurate to within a factor of 2-3 and therefore can be used to accurately resolve any order-of-magnitude differences in MOSFET off state leakage current.

The example shown above uses the variable analog input to the OEN pins of the INVZ cells. However, the PMOSFET-limited operation is also valid (tie OEN to VSS and vary the voltage on OE).

It is not necessary to formally use INVZ cells. For instance, INV cells could be used and NMOS footer or PMOS header MOSFETs could be used to current-limit the oscillator frequencies.

The ratio of device widths N0/N1 can be varied in order to optimize the accuracy of the results. For instance, making W(N1)=10×W(N0) will shift the response curve by one order of magnitude and may result in more accurate results.

The core of this monitoring circuit for monitoring operating temperature is a ring oscillator formed using standard or modified tri-state inverter cells (INVZ). In the example INVZ schematic below there are three modifications as compared to a standard INVZ cell:
1. The tri-state switches P1 and N1 have a large device width. This is not a requirement for the design, however increasing the width of these devices can potentially allow more reliable operation at the normal rail voltages (0V on OE, VDD on OEN). As noted above, this may simplify the requirements of input voltage generation.
2. The tri-state switches are moved to be adjacent to the rails. This also is not required but can potentially increase accuracy due to reduced body effects as compared to when devices P1/N1 are next to the output Z
3. In this example, the body of P1 is also tied to OEN, not to VNW as normal. The reason for this change will be described below.

Figure 14:
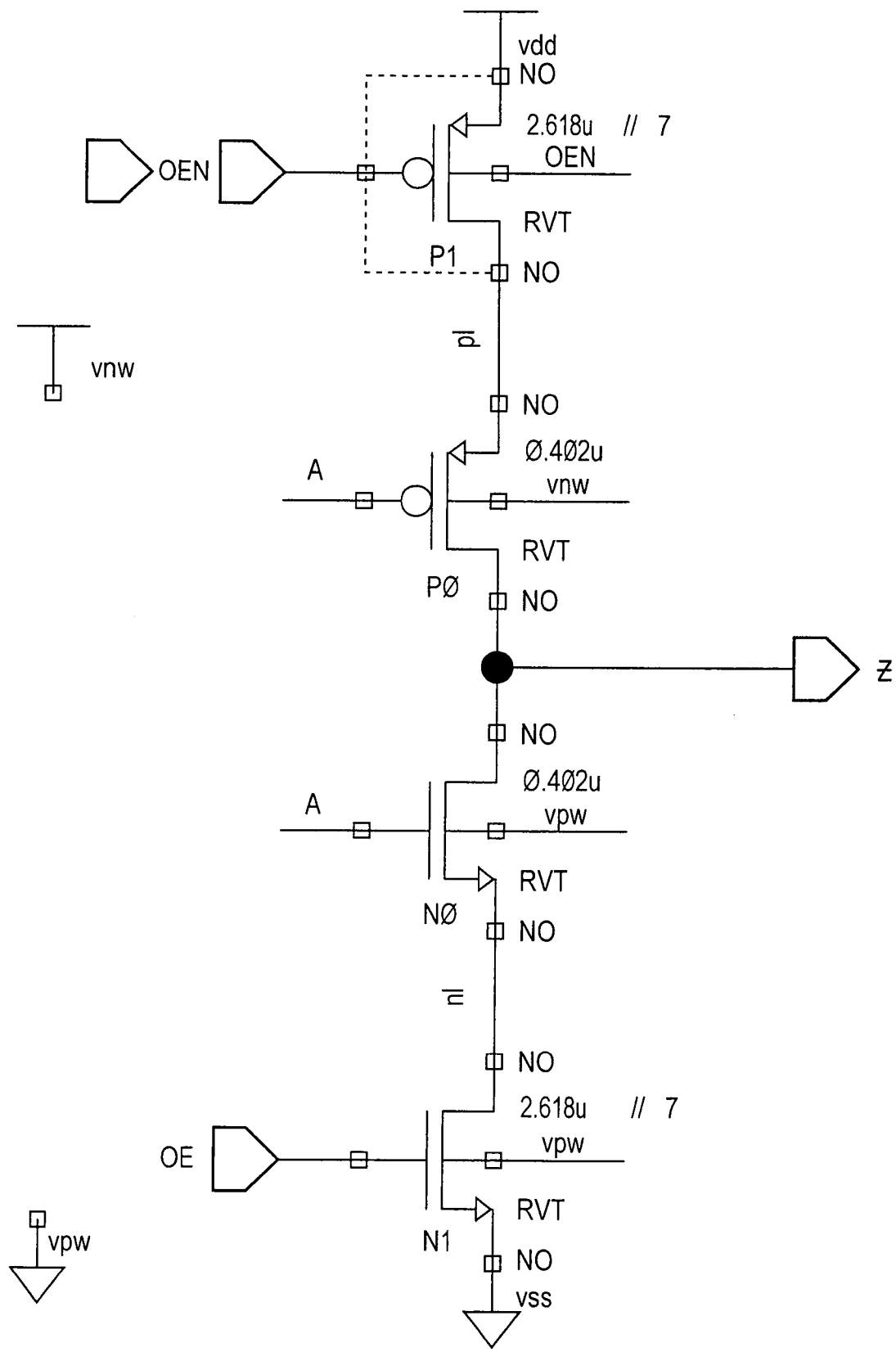
FIG. 14 is a schematically diagram illustrates a tri-state inverter for use in a ring oscillator serving as a temperature monitoring circuit.
Figure 15:
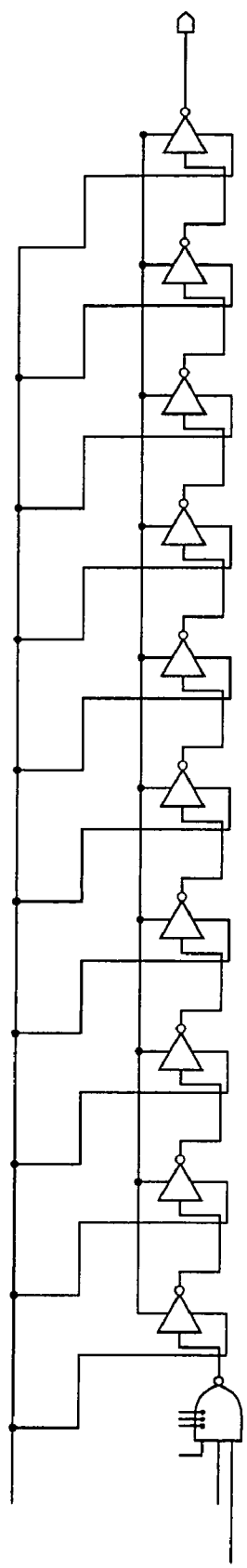
FIG. 15 schematically illustrates a ring oscillator circuit for use as a temperature monitoring circuit.

The tri-state inverter of FIG. 14 is used to form a ring oscillator with one possible implementation shown in FIG. 15. In the ring oscillator of FIG. 15 one NAND gate has been added to provide oscillator enable function. In the example shown the OE pins are tied to VDD and the OEN pins are tied to POWER_EN_N which in this use is a variable analog signal. The number of stages is arbitrary, but it should be noted that this oscillator can be reliably operated with fewer stages than shown, due to the very slow operating speeds and power consumption due to the nA-range current limited operation. The basic ring oscillator requirement of an odd total number of stages (including NAND) is observed.

A key principle of operation of this invention is that the MOSFET(s) used as oscillator current limiters be biased in the subthreshold region and that the devices used exhibit an ideal subthreshold slope, where current is proportional to $e^{(Vg-Vt)/kT}$ and k is the Boltzmann constant (8.62e-5 eV/K) and T is the temperature in degrees Kelvin.

Simulations using industry-representative 32 nm MOSFET PSP HSPICE models show that this assumption is valid across a suitable bias temperature and voltage. Note the near perfect R2 values in the exponential trend line fits in the Figure below, which shows the current through a device P1 from FIG. 1 as a function of "VBS", which is equivalent to "VGS" as they are tied to the same node in this implementation.

Figure 16:
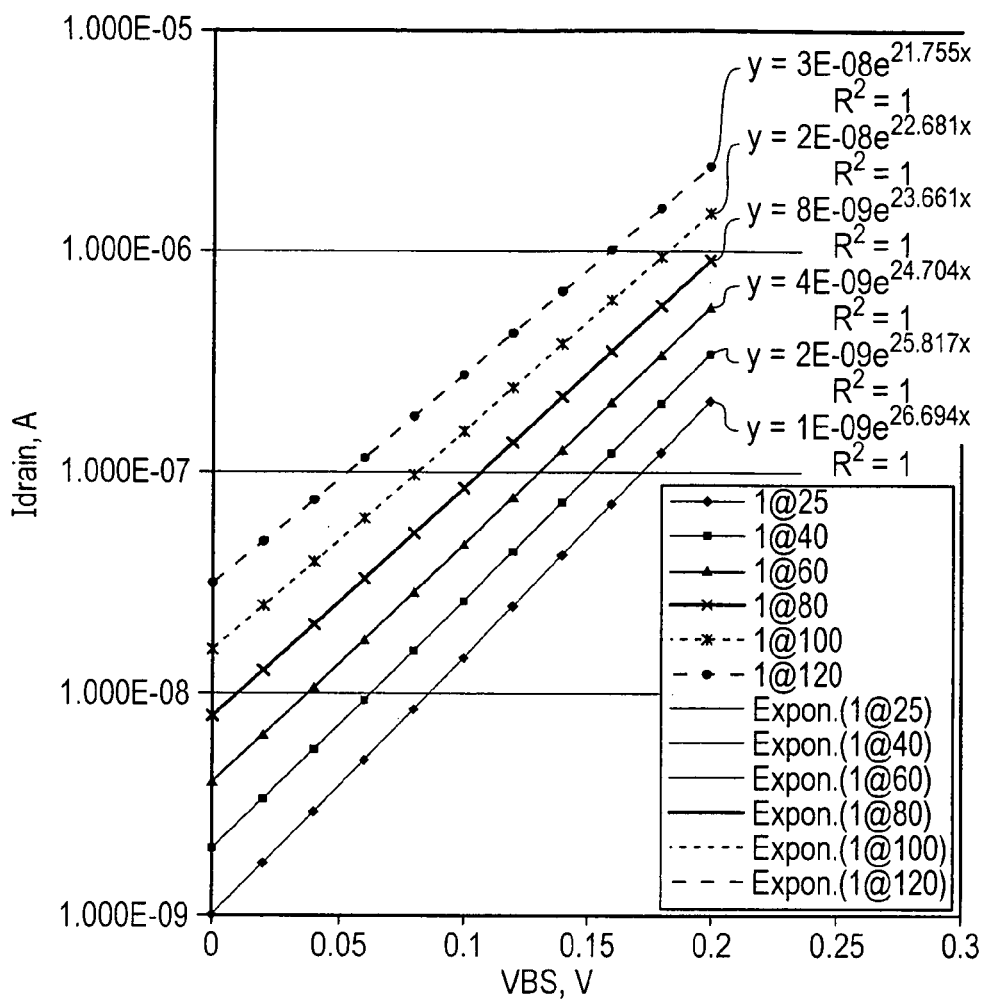
FIG. 16 schematically illustrates the relationship between the drain current through the PMOSFET of FIG. 14 with the voltage between the bulk and the source of the current limiting transistor operating in leakage mode.

FIG. 16 shows PMOSFET drain current as a function of VBS (=VGS). In this configuration, the PMOSFET current is proportional to $e^{VBS/kT}$. Using the exponential slopes of the trend line fits in FIG. 16, and calibrating the results to T=25 C, one can then measure the current at any subsequent measurement and extrapolate the temperature as proportional to exp(1/kT). The results are shown in FIG. 17 to be accurate across process corners and are within a few percent of actual temperature to at least 100 C above the calibration temperature.

Figure 17:
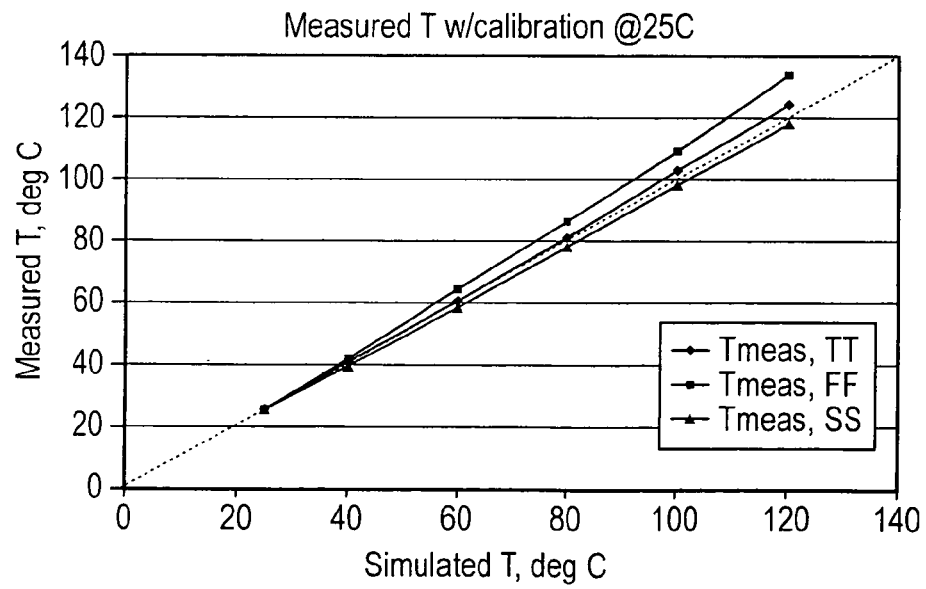
FIG. 17 illustrates the variation between measured temperature and simulated temperature when measured using a monitoring circuit as illustrated in FIG. 15.
Figures 18, 19:
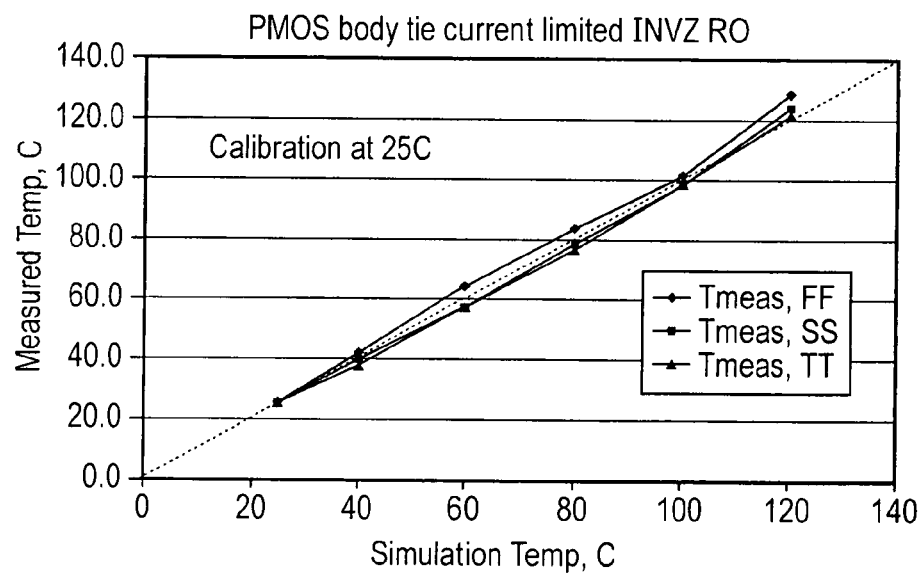
FIG. 18 shows an equation expressing the current through a transistor operating in leakage mode as a function of temperature, the voltage between the gate and the source, the voltage between the bulk and the source and the voltage between the drain and the source.
FIG. 19 illustrates the relationship between measured temperature and simulated temperature with a PMOSFET current limiting transistor within a ring oscillator with the body tied to the gate of the transistor.

FIG. 17 shows measured temperature as extracted from PMOS drain current using the above algorithm, calibrated measurement at T=25 C. The feature of setting VGS=VBS allows the current to be exponentially dependent on 1/kT instead of 1/nkT, where 'n' is the subthreshold slope non-ideality factor. This can be explained as follows, based on the subthreshold MOSFET model presented by Chen and Ho in IEEE TRANSACTIONS ON COMPUTER-AIDED DESIGN OF INTEGRATED CIRCUITS AND SYSTEMS, VOL. 16, NO. 4, APRIL 1997, page 343. as shown in the expressions of FIG. 18.

The third exponential term, dependent on $V_{DS}$, can be disregarded for any $V_{DS}$ larger than a few times the thermal voltage (kT=26 mV at 25 C). For a current limited RO design, the $Y_{DS}$ seen by the current limiting device will usually be $V_{DD}/2$ and higher, as any subsequent stage "N+1" in the ring oscillator will begin to switch at this value, and whatever happens to the stage "N" is irrelevant to the RO delay. Therefore in this implementation the third exponential term can be entirely disregarded. The simulations shown here are all for full saturation ($V_{DS}=V_{DD}$).

One can operate the MOSFET at VBS=0V and the second exponential term will disappear. In this case, one obtains the classical behaviour where Idrain is proportional to $\exp(V_{GS}/nkT)$. Operation in this way is explained further in the "Alternative Design" section, number 3).

For the primary form of this invention, one sets $V_{BS}=V_{GS}$, and then the $V_{BS}/nkT$ and $V_{GS}/nkT$ terms cancel and one is left with the $V_{BS}/kT$ dependence shown in FIG. 16 above.

It is known that, for suitable current levels, a current limited ring oscillator's frequency will directly track the value of the feeder current. So not unexpectedly, a full simulation of the circuit shown in FIGS. 14 and 15 yields the result shown in FIG. 19, which is very similar to the MOSFET current simulations of FIG. 18.

To generate the measurements in FIG. 19, the following procedure was used:
1) "Known" temperature 25 C set.
2) Oscillator frequency measured at VB=VG=0.8V (VBS=VGS=0.2V).
3) Oscillator frequency measured at VB=VG=0.84V.
4) Intermediate Tcal calculated as (0.84V−0.8V)/(k*ln (Freq1/Freq2)
5) Offset temperature Toffset calculated as Tcal−25 C.
6) Temperature changed
7) Repeated steps 2-4
8) Measured T calculated as Teal−Toffset For the limited voltage space simulated, the 0.8V and 0.84V voltage levels produced the good fit.

In addition to the core circuit described above, the full solution may require the addition of circuitry to generate input voltage levels, in the case where single input voltage at the rail voltage is not used. Additionally, the ring oscillator output described above would need to be sent to a counter for digital readout. The counter may already exist in the full chip design.

The example shown above uses the variable analog input to the OEN pins of the INVZ cells. However, the opposite polarity operation is also valid (tie OEN to VSS and vary the voltage on OE).

It is not necessary to formally use INVZ cells. For instance, INV cells could be used and NMOS footer or PMOS header MOSFETs could be used to current-limit the oscillator frequencies.

The same circuit can be constructed with the current-limiting MOSFET bodies tied to their normal well potentials. In this case, the subthreshold slope will be proportional to 1/nKT instead of 1/KT, where n is the well known "ideality factor". To use this circuit, one first solves for 'n' using two measurements at the same T and then assumes this 'n' is independent of voltage and temperature (which is usually a good assumption). The advantage of the principal embodiment is the independence on 'n'. This ideality factor presents several limitations on ultimate accuracy
   a. 'n' can vary widely from technology to technology
   b. 'n' has a body bias dependence
   c. 'n' is dependent on oxide trapped charge, and therefore can change from device to device within the same integrated circuit.

In the FIG. 20 results, the NMOS pulldown FET (device N1 of FIG. 14), has been replaced with an ideal current source in a SPICE simulation. This simulation shows the accuracy of the assumption that F is directly proportional to I. The green line represents the circuit frequency as a function of the feeding current from the current source At high currents, the pulldown delay becomes short enough to be comparable to the pull-up delay and therefore the overall delay ceases to be dominated by the current-limiting device. At low frequencies, other parasitic leakage currents begin to become significant. So in this example, optimum operation is between 1 nA and 1 uA of feeding current, corresponding to frequencies between 100 kHz and 100 MHz. The absolute errors in Frequency with respect to input current are shown in the table in FIG. 21.

With the full INVZ including device N1, the Frequency response as compared to the input voltage OE is shown in FIG. 22.

The INVZ line is the current sourced by device N1 of FIG. 14. Vtsat of this NMOSFETs was approximately 360 mV.

Figure 23:
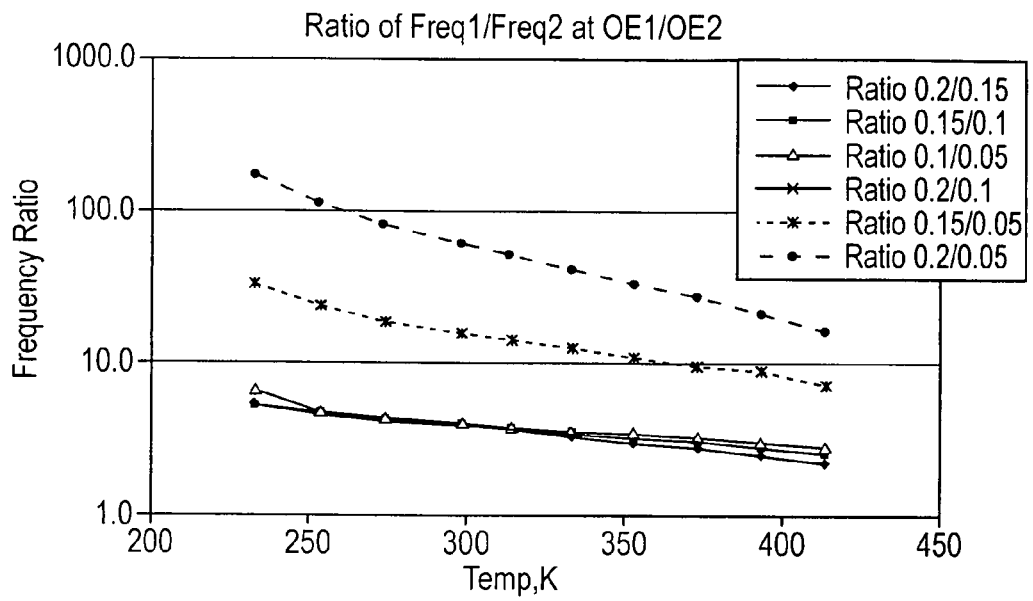
FIG. 23 schematically illustrates frequency ratio as a function of temperature for various input voltage pairs.

As in the primary example, the absolute subthreshold current for a given OE voltage will vary considerably depending on Vt and other factors, but the ratio of two frequencies at different OE voltages is relatively stable. In FIG. 23 the frequency ratio across temperatures with different OE voltage differences is shown:

The temperatures measurement algorithm would then be:
1. Measure Frequency at known temperature and two OE voltages within accurate sensing region (in these simulations 50 mV to 200 mV is optimum)
2. Solve for ideality factor n.
3. Calibrate temperature measurement for the calculated n and known T.

Figure 24:
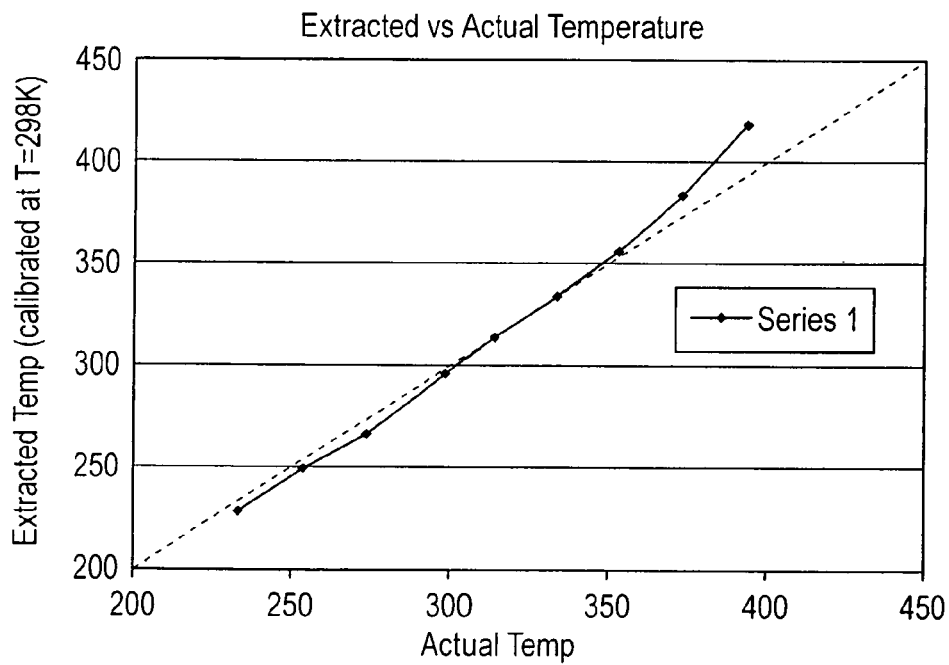
FIG. 24 schematically illustrates extracted temperature measurements using the monitoring circuit and techniques discussed above with calibration performed at 298K.

Example results with initial calibration at 298 degrees Kelvin are shown in FIG. 24.

The primary measurement algorithm using the ratio of two frequencies is used in order to cancel variations of the threshold voltage with varying temperature. However, if a less accurate temperature measurement is tolerable (overheating sensor, e.g.), then only one frequency measurement at one bias potential can be used. If the circuit is designed properly, it can operate with the gate potential of the current limiting device at the supply voltage (VGS=0V), eliminating the need for generation of any analog input voltage levels.

Figure 25:
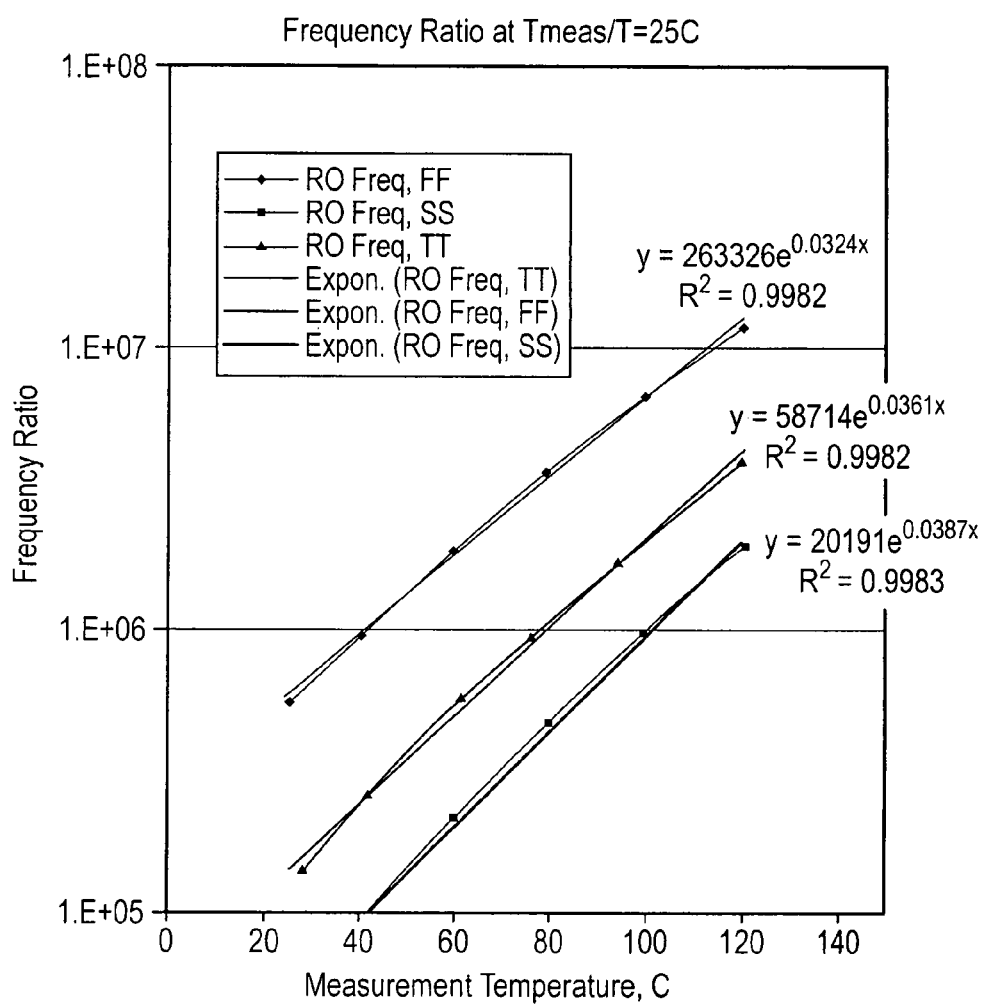
FIG. 25 illustrates the variation in oscillator frequency as a function of temperature.

The variation of frequency (not frequency ratio) as a function of temperature is shown in FIG. 25 for the primary circuit and for VBS=VGS=0V.

The large variation in absolute frequency as a function of temperature is seen in FIG. 25, as well as a variation in slope. Due to the variation in slope, a single frequency measurement method will be less accurate than the two frequency ratio method described in the primary invention. The fact that this dependence is primarily a Vt dependence makes this method not portable between technologies. For the representative 32 nm technology simulated here, one can however take an assumed slope from the HSPICE simulations (TT corner), and apply that slope (0.0361V) to create a temperature measurement by measuring at an initial known temperature then calculating subsequent temperatures by assuming the frequency is proportional to exp(0.0361V/kT). Results from this technique are shown in FIG. 26.

Figure 26:
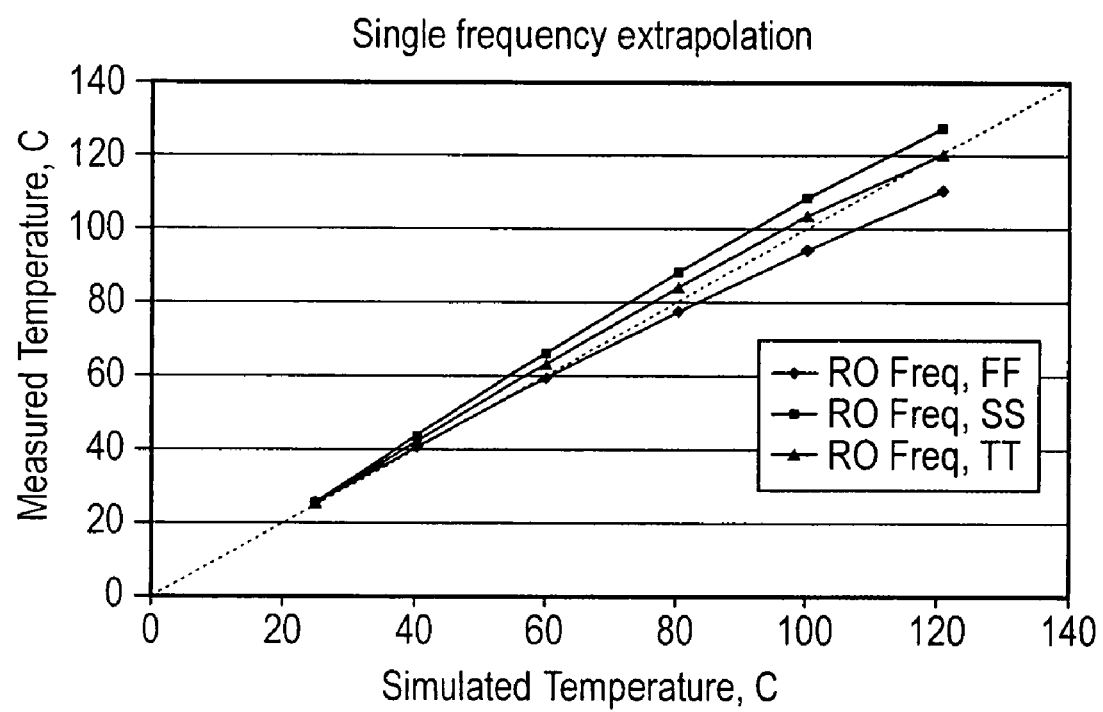
FIG. 26 illustrates measured temperature against simulated temperature when an alternative method is used to extract the temperature information.

While the results of FIG. 26 appear to have similar accuracy as compared to the two frequency ratio method results shown in FIGS. 18 and 22, the reliance on HSPICE simulations to determine the slope, and the variation of slope with process changes, implies that this method may be less accurate.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of monitoring an operating parameter of an integrated circuit, said method comprising the steps of:
   generating an oscillating signal at an oscillation frequency with a ring oscillator comprising a plurality of serially connected inverting stages;
   operating at least one of said inverting stages such that at least one transistor supplying current to said inverting stage limits current flow in and output signal slew rate of said inverting stage and thereby controls said oscillation frequency; and
   supplying a gate voltage to said transistor to operate said transistor in a leakage mode in which substantially all current flow through said transistor is by current leakage; wherein
   said operating parameter controls a magnitude of said current leakage such that said oscillation frequency is dependent upon said operating parameter, wherein said operating parameter is a threshold value of said gate voltage at which said leakage current is substantially zero.

2. A method as claimed in claim 1, wherein said operating parameter is leakage current through said transistor at a given gate voltage.

3. A method as claimed in claim 1, wherein said threshold value is determined by:
   identifying a maximum transconductance gate voltage of said transistor as a gate voltage at which a rate of increase of said oscillation frequency with gate voltage is a maximum;
   linearly backward extrapolating from said maximum transconductance gate voltage and said rate of increase of oscillation frequency at said maximum transconductance gate voltage to identify an extrapolated gate voltage at which said oscillation frequency would be zero; and
   using said extrapolated gate voltage as said threshold value.

4. A method as claimed in claim 1, wherein said operating parameter is an operating temperature of said transistor.

5. A method as claimed in claim 4, wherein said transistor is a MOSFET having a source voltage and a bulk voltage and said transistor is operated such that a voltage difference VGS between said gate voltage and said source voltage is substantially equal to a voltage difference VBS between said bulk voltage and said source voltage.

6. A method as claimed in claim 5, wherein said leakage current is proportional to $e^{VBS/kT}$, where e is the base of natural logarithms, k is the Boltzmann constant and T is said operating temperature.

7. A method as claimed in claim 6, comprising calibrating with the steps:
   (a) providing said integrated circuit including said ring oscillator at a known temperature $T_{known}$;
   (b) setting said voltage difference VBS between said bulk voltage and said source voltage to a first value $VBS_0$;
   (c) measuring a first oscillation frequency $F_0$ of said ring oscillator;
   (d) setting said voltage difference VBS between said bulk voltage and said source voltage to a second value $VBS_1$;
   (e) measuring a second oscillation frequency $F_1$ of said ring oscillator;
   (f) determining a calculated temperature $T_{cal}$ as $(VBS_1-VBS_0)/(k*\ln(F_0/F_1))$; and
   (g) calculating an offset temperature $T_{offset}$ as $T_{cal}-T_{known}$; whereby
   an unknown temperature $T_{unknown}$ of said integrated circuit can then be determined by repeating steps (b) to (f) and determining $T_{unknown}$ as $T_{cal}-T_{offset}$.

8. A method as claimed in claim 1, wherein a plurality of inverting stages within said ring oscillator each include a transistor operating in said leakage mode and limiting current flow in and output slew rate of their inverting stage.

9. A method as claimed in claim 1, wherein all inverting stages within said ring oscillator each include a transistor operating in said leakage mode and limiting current flow in and output slew rate of their inverting stage.

10. A method as claimed in claim 1, wherein said inverters are tri-state inverters.

11. A method as claimed in claim 10, wherein said tri-state inverters each include a header transistor and a footer transistor formed on different rails through said integrated circuit than a rail at which an output signal of said tri-state inverter is generated.

12. A method as claimed in claim 1, wherein said transistor operating in said leakage mode has a different size to other transistors forming said inverter.

13. A method as claimed in claim 1, wherein said transistor operating in said leakage mode is a NMOSFET.

14. A method as claimed in claim 1, wherein said transistor operating in said leakage mode is a PMOSFET.

15. A monitoring circuit configured to monitor an operating parameter of an integrated circuit, said monitoring circuit comprising:
   a ring oscillator having a plurality of serially connected inverting stages configured to generate an oscillating signal at an oscillation frequency, at least one of said inverting stages having at least one transistor configured to supply current to said inverting stage and to limit current flow in and output signal slew rate of said inverting stage thereby controlling said oscillation frequency; and
   gate voltage supply circuitry configured to supply a gate voltage to said transistor to operate said transistor in a leakage mode in which substantially all current flow through said transistor is by current leakage; wherein
   said operating parameter controls a magnitude of said current leakage such that said oscillation frequency is dependent upon said operating parameter, and wherein said operating parameter is a threshold value of said gate voltage at which said leakage current is substantially zero.

16. A monitoring circuit configured to monitor an operating parameter of an integrated circuit, said monitoring circuit comprising:
   a plurality of serially connected inverting stage means for generating an oscillating signal at an oscillation frequency, at least one of said inverting stage means having at least one transistor means for supplying current to said inverting stage means and to limit current flow in and output signal slew rate of said inverting stage means thereby controlling said oscillation frequency; and gate voltage supply means for supplying a gate voltage to said transistor means to operate said transistor means in a leakage mode in which substantially all current flow through said transistor means is by current leakage; wherein said operating parameter controls a magnitude of said current leakage such that said oscillation frequency is dependent upon said operating parameter, and wherein said operating parameter is a threshold value of said gate voltage at which said leakage current is substantially zero.

17. A method of monitoring an operating parameter of an integrated circuit, said method comprising the steps of:

generating an oscillating signal at an oscillation frequency with a ring oscillator comprising a plurality of serially connected inverting stages;

operating at least one of said inverting stages such that at least one transistor supplying current to said inverting stage limits current flow in and output signal slew rate of said inverting stage and thereby controls said oscillation frequency; and supplying a gate voltage to said transistor to operate said transistor in a leakage mode in which substantially all current flow through said transistor is by current leakage; wherein said operating parameter controls a magnitude of said current leakage such that said oscillation frequency is dependent upon said operating parameter, wherein said operating parameter is an operating temperature of said transistor, and wherein said transistor is a MOSFET having a source voltage and a bulk voltage and said transistor is operated such that a voltage difference VGS between said gate voltage and said source voltage is substantially equal to a voltage difference VBS between said bulk voltage and said source voltage.

18. A method as claimed in claim 17, wherein said leakage current is proportional to $e^{VBS/kT}$, where e is the base of natural logarithms, k is the Boltzmann constant and T is said operating temperature.

19. A method as claimed in claim 18, comprising calibrating with the steps:

(a) providing said integrated circuit including said ring oscillator at a known temperature $T_{known}$;
(b) setting said voltage difference VBS between said bulk voltage and said source voltage to a first value $VBS_0$;
(c) measuring a first oscillation frequency $F_0$ of said ring oscillator;
(d) setting said voltage difference VBS between said bulk voltage and said source voltage to a second value $VBS_1$;
(e) measuring a second oscillation frequency $F_1$ of said ring oscillator;
(f) determining a calculated temperature $T_{cal}$ as $(VBS_1-VBS_0)/(k*\ln(F_0/F_1))$; and (g) calculating an offset temperature $T_{offset}$ as $T_{cal}-T_{known}$; whereby an unknown temperature $T_{unknown}$ of said integrated circuit can then be determined by repeating steps (b) to (f) and determining $T_{unknown}$ as $T_{cal}-T_{offset}$.

20. A monitoring circuit configured to monitor an operating parameter of an integrated circuit, said monitoring circuit comprising:

a ring oscillator having a plurality of serially connected inverting stages configured to generate an oscillating signal at an oscillation frequency, at least one of said inverting stages having at least one transistor configured to supply current to said inverting stage and to limit current flow in and output signal slew rate of said inverting stage thereby controlling said oscillation frequency; and gate voltage supply circuitry configured to supply a gate voltage to said transistor to operate said transistor in a leakage mode in which substantially all current flow through said transistor is by current leakage; wherein said operating parameter controls a magnitude of said current leakage such that said oscillation frequency is dependent upon said operating parameter, wherein said operating parameter is an operating temperature of said transistor, and wherein said transistor is a MOSFET having a source voltage and a bulk voltage and said transistor is operated such that a voltage difference VGS between said gate voltage and said source voltage is substantially equal to a voltage difference VBS between said bulk voltage and said source voltage.

21. A monitoring circuit configured to monitor an operating parameter of an integrated circuit, said monitoring circuit comprising:

a plurality of serially connected inverting stage means for generating an oscillating signal at an oscillation frequency, at least one of said inverting stage means having at least one transistor means for supplying current to said inverting stage means and to limit current flow in and output signal slew rate of said inverting stage means thereby controlling said oscillation frequency; and gate voltage supply means for supplying a gate voltage to said transistor means to operate said transistor means in a leakage mode in which substantially all current flow through said transistor means is by current leakage; wherein said operating parameter controls a magnitude of said current leakage such that said oscillation frequency is dependent upon said operating parameter, wherein said operating parameter is an operating temperature of said transistor, and wherein said transistor means is a MOSFET having a source voltage and a bulk voltage and said transistor means is operated such that a voltage difference VGS between said gate voltage and said source voltage is substantially equal to a voltage difference VBS between said bulk voltage and said source voltage.

* * * * *